United States Patent [19]

Kishimoto et al.

[11] Patent Number: 5,147,850
[45] Date of Patent: Sep. 15, 1992

[54] METHOD FOR INCREASING TC OF OXIDE SUPERCONDUCTORS

[75] Inventors: Nobuji Kishimoto, Osaka, Japan; Hiroshi Yamamoto, College Station, Tex.

[73] Assignee: Nippon Shokubai Co., Ltd., Osaka, Japan

[21] Appl. No.: 680,076

[22] Filed: Apr. 3, 1991

[30] Foreign Application Priority Data

Apr. 3, 1990 [JP] Japan .................................... 2-89782

[51] Int. Cl.$^5$ .............................................. B05D 5/12
[52] U.S. Cl. ...................................... 505/1; 505/725; 505/782; 427/62; 427/343
[58] Field of Search ................... 505/1, 780, 782, 725; 427/62, 63, 343, 337

[56] References Cited

U.S. PATENT DOCUMENTS 4,959,347 9/1990 Kobayashi et al. ..................... 505/1

OTHER PUBLICATIONS

Ishida et al, "Critical Temperature Enhancement of $Bi_2Sr_2CaCuO_x$ by Phendization", Appl. Phys. Lett. 55(14) Oct. 1989, pp. 1457–1459.
Japanese Journal of Applied Physics, vol. 28, No. 2, Feb. 1989, pp. L217–L218, Hayashi et al: "A New Method for Improving the Superconducting Transition Temperature of Platy . . . ".
Materials Letters, vol. 9, No. 4, Feb. 1990, pp. 154–156 Murthy et al: "A new Coprecipitation Technique for the Preparation of Superconducting Oxides."

*Primary Examiner*—Michael Lusignan
*Assistant Examiner*—Roy V. King
*Attorney, Agent, or Firm*—Oblon, Spivak, McClelland, Maier & Neustadt

[57] ABSTRACT

The present invention provides a process for producing a superconducting material capable of elevating the Tc of oxide superconductors, in particular Bi-based superconductors. The feature of the present invention resides in a process for producing an oxide superconductor, in which a intermediate product or a product showing superconducting property is treated with a solution containing a compound having a reducing or oxidizing function. As the compound having a reducing function, compounds having two or more enolic hydroxy groups, cycloaliphatic polyhydric alcohol compounds or inorganic type reducing compounds are preferred. As the compound having oxidizing function, there can be mentioned, for example, carbonyl compounds, ozone, hydrogen peroxide, organic peroxide, dimethylsulfoxide and permanganate.

7 Claims, No Drawings

METHOD FOR INCREASING TC OF OXIDE SUPERCONDUCTORS

DESCRIPTION

1. Technical Field

The present invention concerns a process for producing an oxide superconductor and, more in particular, it relates to a process for producing an oxide superconductor capable of elevating a superconducting transition temperature (hereinafter simply referred to as Tc).

2. Background Art

From since it has been demonstrated that La-Ba-Cu oxides show superconducting characteristics, oxide superconductors have attracted attention as those capable of outstandingly elevating the Tc that was attained by intermetallic compound superconductors typically represented by $Nb_3Sn$, and there have been known so far Y-Ba-Cu oxide superconductors having Tc in the order of 90K, Bi-Sr-Ca-Cu oxide superconductors having Tc in the order of 110K and Tl-Ba-Ca-Cu oxide superconductors having Tc in the order of 120K.

For example, Bi-based superconductors have different Tc depending on the composition for Bi, Sr, Ca and Cu and shows Tc, for example, of about 105 to 110K when the composition ratio is 2:2:2:3 (hereinafter referred to as a high-Tc phase). However, if the composition ratio is, for example, 2:2:1:2 (hereinafter referred to as a low-Tc phase), Tc is about 75 to 80K. It can be said that the high-Tc phase and the low-Tc phase are liable to be mixed under general production conditions making it technically difficult to obtain a composition consisting only of the high-Tc phase.

In addition, although it has been known that partial substitution of Bi with Pb in the Bi-based oxide superconductors is effective for promoting the formation of the high-Tc phase, it can not contribute to the improvement of Tc.

DISCLOSURE OF THE INVENTION

The present invention has been achieved in view of the foregoing situation and provides a process for producing a superconducting material capable of elevating the Tc of oxide superconductors.

The feature of a process for producing an oxide superconductor according to the present invention for attaining the foregoing object resides in a process for producing an oxide superconductor, in which an intermediate product or a product showing superconducting property in a production step for an oxide superconductor is treated with a solution containing a compound having a reducing or oxidizing function.

BEST MODE FOR PRACTICING THE INVENTION

It is known that oxide superconductors have a layered perovskite structure, and holes (positive holes) or electrons in some of them formed in the structure constitute carriers for superconduction which control the superconducting characteristic.

In the course of an earnest study for the relationship between superconduction carrier density and Tc, the present inventors have attained a knowledge that when an intermediate product or a product showing a superconducting property in a production step for an oxide superconductor is treated with a solution containing a compound having a reducing or oxidizing function as a method of changing the carrier density, it is effective for elevating the Tc and has accomplished the present invention.

Although the temperature elevation for Tc has not yet been analyzed completely at present, it has been known in the case of oxide superconductors, there are several reports that some correlation is found between the change of Tc and the change of the length along the direction of C-axis (hereinafter referred to as C-axis length) in the perovskite structure, and the effect of the process according to the present invention can be found definitely also as the change of the C-axis length as described later. However, not all of compounds having reducing function can be applied the process according to the present invention. That is to say, the temperature elevation for Tc cannot be attained with excessively strong or weak reducing function. Then, applicable compound is restricted to one of compounds having two or more enolic hydroxy groups, cycloaliphatic polyhydric alcohol compounds and inorganic type reducing compounds, with proper reducing power.

As the compound having two or more enolic hydroxy groups, there can be mentioned, for example, hydroquinone, hydrotoluquinone, cathecol, pyrogallol, fluoroglycinol, 1,2,4-benzenetriol, dihydroxynaphthalene and dihydroxyanthracen. As the cycloaliphatic polyhydric alcohol compound, there can be mentioned, for example, cyclopentanediol, cyclohexanediol and cyclohexadienediol.

As the inorganic type reducing compound, there can be mentioned, for example, hydrazine, diimide and the metal hydrogen complex compounds like sodium borohydride and lithium aluminum hydride, in which sodium borohydride may be any of related compounds such as $NaBH_4$, $Na_2B_2H_6$, $Na_2B_4H_{10}$ and $Na_2B_5H_9$.

As the compound having oxidizing function suitably used for the producting process according to the present invention, there can be mentioned, for example, carbonyl compound, ozone, hydrogen peroxide, organic peroxide, dimethylsulfoxide and permanganate.

As the carbonyl compound, cycloaliphatic compound is preferred and quinones are more preferred. As the quinones, there can be mentioned, for example, benzoquinone, toluquinone, naphthoquinone, anthraquinone, 2,3-dichloro-5,6-dicyano-1,4-benzoquinone, tetrachloro-1,4-benzoquinone and tetrachloro-1,2-benzoquinone. As the cycloaliphatic carbonyl compounds other than the quinones, there can be mentioned, for example, cyclopentanone, cyclopentadione, cyclohexanone, cyclohexadione and cyclohexadienone.

Further, as the organic peroxides, there can be mentioned for example, tert-butylhydroperoxide, cumenyl hydroperoxide, benzoyl peroxide, di-p-chlorobenzoyl peroxide, di-isopropyl percarbonate, tert-butyl perbenzoate, tert-butyl peracetate and di-tert-butyl peroxide.

Oxide superconductors usable in the production process of the present invention have no restriction regarding their forms and they may be in any of shapes such as powder, bulk, wire or thin film. Further, a bulk-form oxide superconductor is generally produced by mixing starting powders, drying and molding them, and applying preliminary calcination to obtain a precursor, which is then sintered for once or plurality of times to obtain an oxide superconductor. The intermediate product after the precursor may be applied to the production process according to the present invention.

The production process according to the present invention will now be described referring to a case of producing a bulk-form oxide superconductor as a typical example.

At first, metal elements constituting the oxide superconductor preferably contain at least Bi, Sr, Ca and Cu in which Bi may be partially substituted with Pb or Sr may be partially substituted with La, etc.

There is no particular restriction for the starting compounds for supplying the metal element as described above and an inorganic acid salt such as carbonate, nitrate and sulfate, an organic acid salt such as acetate and oxalate or alkoxide compound and complex compound are applicable in addition to oxides.

There is also no particular restriction on the mixing method and it can properly be selected from known methods such as mechanical mixing, uniform solubilization or coprecipitation depending on the kind and the physical property of the compound.

A mixture comprising the starting compounds is dried as required and then calcined. After calcination, pulveriging molding step and sintering are preferably applied one or more times and the final sintering temperature is preferably higher than 800° C.

The production process inherent to the present invention lies in treating a sintered molding product with a solution containing a compound having a reducing or oxidizing (hereinafter sometimes referred to as a treating solution) and then dried. As the treating method, soaking of the molding product in a treating solution is preferred and, in addition, the treating solution may be sprayed intermittently or continuously.

A solvent constituting the treating solution is preferably a non-aqueous solvent in view of the stability of the superconductor and methanol or toluene can be exemplified.

In the production process according to the present invention, there is no restriction for the concentration of the treating solution described above, processing time and temperature, but it is preferred for preparing homogenous product to apply a treatment for a period of time with the concentration of the treating solution of 0.1M or less, and the treatment for more than one hour is preferred in a case of treatment at a room temperature. After the treatment, washing is applied with a solvent such as methanol as required and then drying is applied. Although there is no particular restriction for drying conditions, moderate drying by blowing at a low temperature is preferred.

The oxide superconductor produced through the foregoing steps show a difference of a remarkable improvement for Tc as compared with the oxide superconductors by the conventional production process. Further, in addition to the change of Tc, a distinct difference in the production process according to the present invention also lies in as the change of the C-axis length in the layered perovskite structure, which is considered to be attributable to that improvement for Tc is attained by the change of the crystal structure and electron structure due to the treatment.

The present invention will now be explained reffering to examples.

EXAMPLE 1, COMPARATIVE EXAMPLE 1,2

Commercial reagents for $Bi(NO_3)_3.5H_2O$, $Sr(NO_3)_2$, $Ca(NO_3)_2.4H_2O$ and $Cu(NO_3)_2.3H_2O$ (manufactured by Wako Junyaku Co. at 99.9% purity) were used and weighted such that the metal atom ratio was $Bi_2Sr_2Ca_1Cu_2$. They were mixed under stirring while heating, so that the nitrates were gradually melted into a homogenous solution. After drying the homogenous solution in a drying oven at 230° C. for 20 hours, it was calcined in atmospheric air at 800° C. for 10 hours to obtain a precursor. The precursor was pulverized and thus obtained powder was press-molded into a disc of about 15 mm diameter and about 2 mm thickness and sintered in atmosphere at 820° C. for 20 hours. The molding product obtained in this stage was a conventional Bi-based oxide superconductor of the low-Tc phase, which was used as a test specimen in Comparative Example 1.

The molding product described above was soaked into 0.1M benzoquinone solution in methanol at a room temperature for 6 hours, washed with methanol for one hour and, subsequently, dried under blowing of an atmospheric air at a room temperature to obtain a test specimen of Example 1.

A test specimen of Comparative example 2 was obtained in the same manner as in Example 1 except for using methanol instead of 0.1M benzoquinone solution in methanol.

For the test specimen, superconducting transition beginning temperature (hereinafter referred to as $Tc_{onset}$) and 0 resistance temperature (hereinafter referred to as $Tc_0$) were measured by a usual four-terminal method. Further, the C-axis length of the layered perovskite structure was determined by X-ray diffractiometry. The results are shown in Table 1.

EXAMPLES 2–5

A test specimen was obtained in the same manner as in Example 1 except for using toluquinone, naphthoquinone, 2,3-dichloro-5,6-dicyano-1,4-benzoquinone or 1,4-cyclohexanedione instead of benzoquinone, and $Tc_{onset}$ and $Tc_0$ and C-axis length were measured. The results are also shown in Table 1.

COMPARATIVE EXAMPLE 3

A test specimen was obtained in the same manner as in Example 1 except for using benzene instead of benzoquinone and $Tc_{onset}$, $Tc_0$ and C-axis length were measured. The results are shown in Table 1.

EXAMPLE 6, COMPARATIVE EXAMPLE 4

Commercial reagents for $Bi(NO_3)_3.5H_2O$, $Pb(NO_3)_2$, $Sr(NO_3)_2$, $Ca(NO_3)_2.4H_2O$ and $Cu(NO_3)_2.3H_2O$ (manufactured by Wako Junyaku Co. at 99.5% purity) were used and weighted such that the metal atom ratio was $Bi_{1.5}Pb_{0.5}Sr_2Ca_2Cu_3$. They were mixed under stirring while heating, so that the nitrates were gradually melted into a homogenous solution. After drying the homogenous solution in a drying oven at 230° C. for 20 hours, it was calcined in atmospheric air at 800° C. for 10 hours to obtain a precursor. The precursor was pulverized and the thus obtained powder was press-molded into a disc of about 15 mm diameter and about 2 mm thickness and sintered in an atmosphere of 0.5 atm of partial oxygen pressure at 840° C. for 150 hours. The molding product obtained in this step was a conventional Bi-based oxide superconductor of the high-Tc phase, which was used as a test specimen in Comparative Example 4.

The molding product described above was soaked into 0.1M benzoquinone solution in methanol at a room temperature for 6 hours, washed with methanol for one hour and, subsequently, dried under blowing of atmospheric air at a room temperature to obtain test specimen of Example 6.

$Tc_{onset}$, $Tc_0$ and C-axis length were measured for the two kinds of test specimens. The results are shown in Table 1 together.

COMPARATIVE EXAMPLE 5

A test specimen was obtained in the same manner as in Example 6 except for using benzene instead of benzoquinone and $Tc_{onset}$, $Tc_o$ and C-axis length were measured. The results are shown in Table 1.

TABLE 1

| | Kind of Compound for treatment (solvent:methanol) | $Tc_{onset}$ (K) | $Tc_O$ (K) | C-axis length (Å) |
|---|---|---|---|---|
| Example 1 | Benzoquinone | 96 | 85 | 30.99 |
| Example 2 | Toluquinone | 95 | 84 | 31.10 |
| Example 3 | Naphthoquinone | 95 | 83 | 31.16 |
| Example 4 | 2, 3-dichloro-5, 6-dicyano 1, 4-benzoquinone | 92 | 80 | 30.87 |
| Example 5 | 1, 4-cyclohexanedione | 93 | 82 | 31.03 |
| Comp. Example 1 | (no treatment) | 84 | 75 | 30.78 |
| Comp. Example 2 | (methanol only) | 84 | 75 | 30.78 |
| Comp. Example 3 | Benzene | 84 | 73 | 30.80 |
| Example 6 | Benzoquinone | 118 | 110 | 37.26 |
| Comp. Example 4 | (no treatment) | 111 | 105 | 37.14 |
| Comp. Example 5 | Benzene | 111 | 103 | 37.15 |

EXAMPLE 7, 8

A test specimen was obtained in the same manner as in Example 1 except for using 0.1M solution of hydroquinone or hydrotoluquinone in toluene instead of 0.1M solution of benzoquinone in methanol, and $Tc_{onset}$, $Tc_o$ and C-axis length were measured. Results are shown in Table 2.

EXAMPLES 9-12

A test specimen was obtained in the same manner as in Example 1 except for using catechol, pyrogallol, 1,4-dihydroxynaphthalene or 3,5-cyclohexadiene-1,2-diol instead of benzoquinone, and $Tc_{onset}$, $Tc_o$ and C-axis length were measured. The results are shown in Table 2 together.

COMPARATIVE EXAMPLE 6

A test specimen was obtained in the same manner as in Example 1 except for using toluene instead of 0.1M benzoquinone solution in methanol and $Tc_{onset}$, $Tc_o$ and C-axis length were measured. The results are shown in Table 1.

EXAMPLE 13

A test specimen was obtained in the same manner as in Example 6 except for using hydrotoluquinone instead of benzoquinone and $Tc_{onset}$, $Tc_o$ and C-axis length were measured. The results are shown in Table 2 together.

TABLE 2

| | Kind of Compound for treatment (solvent:toluene) | $Tc_{onset}$ (K) | $Tc_o$ (K) | C-axis length (Å) |
|---|---|---|---|---|
| Example 7 | Hydroquinone | 97 | 85 | 31.10 |
| Example 8 | Hydrotoluquinone | 95 | 84 | 31.16 |
| Example 9 | Catechol | 94 | 83 | 30.99 |
| Example 10 | Pyrogallol | 95 | 84 | 31.03 |
| Example 11 | 1, 4-dihydroxy-naphthalene | 96 | 83 | 31.18 |
| Example 12 | 3, 5-cyclohexadiene-1, 2-diol | 93 | 82 | 30.95 |
| Comp. Example 1 | (no treatment) | 84 | 75 | 30.78 |
| Comp. Example 6 | (toluene only) | 84 | 75 | 30.78 |
| Example 13 | Hydrotoluquinone | 120 | 111 | 37.30 |
| Comp. Example 4 | (no treatment) | 111 | 105 | 37.14 |

EXAMPLE 14

A test specimen was obtained in the same manner as in Example 1 except for soaking the molding product used as the test specimen in Comparative Example 1 in 0.1M $NaBH_4$ solution in methanol for 24 hours, instead of soaking it in 0.1M benzoquinone solution in methanol for 6 hours, and $Tc_{onset}$, $Tc_o$ and C-axis length were measured. The results are shown in Table 3.

EXAMPLE 15

A test specimen was obtained in the same manner as in Example 1 except for soaking the molding product used as the test specimen in Comparative Example 1 in 0.01M $NH_2NH_2$ solution in methanol for 6 hours, instead of soaking it in 0.1M benzoquinone solution in methanol for 6 hours, and $Tc_{onset}$, $Tc_o$ and C-axis length were measured. The results are shown in Table 3.

EXAMPLE 16

A test specimen was obtained in the same manner as in Example 1 except for soaking the molding product used as the test specimen in Comparative Example 1 in 0.01M $LiAlH_4$ solution in tetrahydrofuran for 24 hours except for soaking it in 0.1M benzoquinone solution in methanol for 6 hours, and $Tc_{onset}$, $Tc_o$ and C-axis length were measured. The results are shown in Table 3.

EXAMPLE 17

A test specimen was obtained in the same manner as in Example 6 except for soaking the molding product used as the test specimen in Comparative Example 4 in 0.1M $NaBH_4$ solution in methanol for 24 hours except for soaking it in 0.1M benzoquinone solution in methanol for 6 hours, and $Tc_{onset}$, $Tc_0$ and C-axis length were measured. The results are shown in Table 3.

TABLE 3

| | Kind of Compound for treatment (solvent:methanol) | $Tc_{onset}$ (K) | $Tc_o$ (K) | C-axis length (Å) |
|---|---|---|---|---|
| Example 14 | $NaBH_4$ | 94 | 83 | 30.89 |
| Example 15 | $NH_2NH_2$ | 94 | 82 | 30.82 |
| Example 16 | $LiAlH_4$ | 95 | 81 | 30.92 |
| Comp. Example 1 | (no treatment) | 84 | 75 | 30.78 |
| Example 17 | $NaBH_4$ | 117 | 109 | 37.24 |
| Comp. Example 4 | (no treatment) | 111 | 105 | 37.14 |

From the foregoing results, it can be seen that by the production process according to the present invention, Tc can be elevated by about 10K for the Bi-based oxide superconductors of the low-Tc phase, and Tc can be elevated by about 5K for Bi-based oxide superconductors of the high-Tc phase.

INDUASTRIAL APPLICABILITY

Since the present invention has been constituted as described above, it can provide a production process of elevating the Tc of oxide superconductors.

We claim:

1. A process for producing an oxide superconductor, in which an intermediate product or a product demonstrating superconducting property in a production step for an oxide superconductor is treated for the purpose of increasing Tc with a solution containing a compound having a reducing or oxidizing function, wherein said compound having a reducing function is at least one member of the group consisting of a compound having two or more enolic hydroxy groups, a cycloaliphatic polyhydric alcohol compound or an inorganic type reducing compound, wherein said compound having an oxidizing function is at least one member of the group consisting of quinones and cycloaliphatic carbonyl compounds, and wherein said treating is achieved by at least one process selected from the group consisting of soaking and spraying.

2. The process for producing an oxide superconductor of claim 1, wherein the intermediate product or the product showing superconducting property is an oxide containing at least Bi, Sr, Ca and Cu.

3. The process for producing an oxide superconductor of claim 1, wherein the compound having two or more enolic hydroxy groups is hydroquinone, hydrotoluquinone, catechol, pyrogallol or dihydroxynaphthalene.

4. The process for producing an oxide superconductor of claim 1, wherein the cycloaliphatic polyhydric alcohol compound is cyclohexadienediol.

5. The process for producing an oxide superconductor of claim 1, wherein the inorganic type reducing compound is $NaBH_4$, $NH_2NH_2$ or $LiAlH_4$.

6. The process for producing an oxide superconductor of claim 1, wherein the quinone is benzoquinone, toluquinone, naphthoquinone or dichlorodicyanobenzoquinone.

7. The process for producing an oxide superconductor of claim 1, wherein the cycloaliphatic carbonyl compound is cyclohexanedione.

* * * * *